Figure 1:
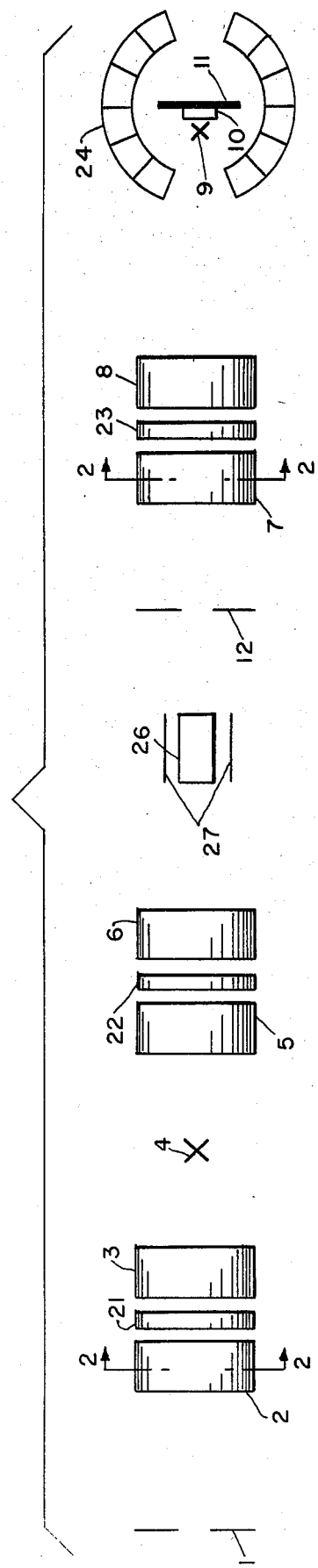

United States Patent [19]

Martin

[11] 4,236,073
[45] Nov. 25, 1980

[54] SCANNING ION MICROSCOPE

[76] Inventor: Frederick W. Martin, 4323 Van Buren St., Hyattsville, Md. 20782

[21] Appl. No.: 801,072

[22] Filed: May 27, 1977

Related U.S. Application Data

[63] Continuation of Ser. No. 431,745, Jun. 5, 1974, abandoned.

[51] Int. Cl.² ............................................. H01J 37/26
[52] U.S. Cl. ..................................... 250/306; 250/309
[58] Field of Search ............... 250/306, 307, 309, 310, 250/311

[56] References Cited

U.S. PATENT DOCUMENTS

| | | | |
|---|---|---|---|
| 2,919,381 | 12/1959 | Glaser | 250/396 |
| 3,617,739 | 11/1971 | Liebl | 250/309 |
| 3,686,499 | 8/1972 | Omura | 250/309 |
| 3,795,813 | 3/1974 | Kunath | 250/311 |

OTHER PUBLICATIONS

"Is a scanning Ion Microscope Possible", Martin, Science, vol. 179, Jan. 1973 pp. 173-175.

Primary Examiner—Craig E. Church

[57] ABSTRACT

A scanning ion microscope is described in which the prior arts of scanning microscopy and achromatic quadrupole lens design as perfected for electrons are utilized for massive high-energy positive ions. Because the De-Broglie wavelength of the massive ions is smaller than the wavelength of electrons, diffraction in the objective lens is reduced. In principle resolution better than one Angstrom can be achieved. Because of the copious production of X-rays and Auger electrons in the specimen by such ions, specimens of atomic dimensions can be examined with a minimum of radiation damage by the ions. The specifically new, novel, and useful feature of this invention is the use of properly focused high-energy heavy-ion beams and the detection of single atomic events in the specimen, which together enable much greater sensitivity and resolution than attainable by other means.

5 Claims, 3 Drawing Figures

SCANNING ION MICROSCOPE

This is a continuation of application Ser. No. 431,745, filed June 5, 1974 now abandoned.

The use of magnetic lenses which act on electrons has enabled the production of microscopes capable of resolving details as small as one Angstrom in diameter, either by conventional transmission electron microscopy, in which electrons transmitted by the specimen are focused and eventually projected to form an image on a photographic plate, or by scanning electron microscopy, in which electrons focused to a microscopically small spot are swept raster-fashion over a small region of a specimen, while information on the interactions of the electrons with the specimen is displayed on a synchronized large raster, usually on a television tube.

Any microscope utilizing electrons suffers from the fundamental problem that the electrons damage the specimen as they interact with it. This problem is often further compounded by the similar interaction of the electrons with the substrate which is always required to support the specimen. For example if a single large molecule is supported on a carbon film which is 25 molecules thick, roughly speaking at least 10,000 electrons must pass through the large molecule in order that the 4 percent increase in scattering caused by the molecule shall exceed the random fluctuations in scattering from neighboring areas through which 10,000 electrons have also passed. Each electron loses energy in the specimen as it passes through, with the principal consequence that chemical bonds in the specimen are broken. Thus the large number of electrons required to separate the specimen from the substrate causes a distintegration of the specimen itself. This disintegration has been well documented and is such that long polymer molecules (such as the biologically significant DNA) are disintegrated before useful information on their structures (such as the order of the bases in DNA, which comprises the "genetic code") can be determined.

The present invention seeks to circumvent this difficulty through the use of magnetic lenses which act on high-energy positive ions, and through the use of interactions of the ions which can produce an atomic emission such as a single electron or an X-ray photon from the specimen alone and not the substrate. In one embodiment the invention consists of a scanning ion microscope in which ions interact to produce characteristic X-rays in the specimen.

Figure 3:
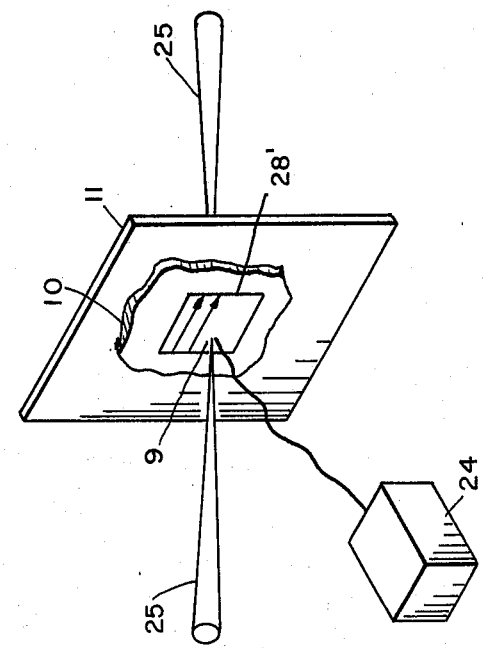
Figure 2:
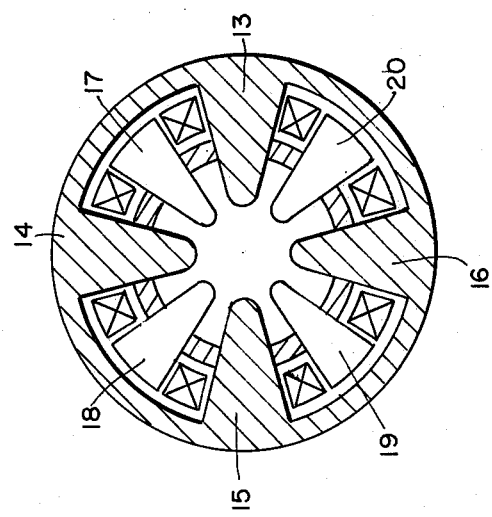

FIG. 1 shows the layout of lenses, specimen, and substrate in this embodiment, FIG. 2 shows a cross section through one of the lenses, and FIG. 3 shows the production of individual quanta of radiation in the focal spot of the ion beam.

This embodiment has a number of advantages:

(1) The characteristic X-rays have a well known energy for each chemical element, and energy-sensitive detectors can be used to discriminate against X-rays emitted by the substrate, as well as to identify interaction with various elements within the specimen. Energy-sensitive detectors can identify "labelled" regions within a specimen, such as the DNA base 5-fluorouracil which has had a fluorine atom chemically substituted within it. The X-rays (even the soft X-rays emitted by carbon) can also penetrate from the center of a large molecule to its perimeter without appreciable interaction, as is not the case for Auger electrons. Lastly and most importantly, since they are the result of interaction of ions with individual atoms rather than complete molecules, X-rays from a chemically disintegrated molecule do not change appreciably in energy from those emitted from the parent molecule and are therefore as useful as those from the parent molecule, provided that the individual atoms have not moved large distances on the substrate.

(2) The production of X-rays in interactions of positive ions with light elements such as carbon is particularly copious, provided that ions of high enough mass and energy are used. For a given ion there is generally an energy at which the production is largest, and for different ions the production at this maximum increases more or less in proportion to the square of the atomic number of the ion. Thus ions heavier than helium are advantageous if they can be accelerated to energies such that the maximum production is obtained. Estimates of the X-ray production have shown that the genetically significant bases in DNA will emit on the order of one X ray before the ring structure of their chemical constitution is fractured by nitrogen ions with 14 million electron volts (MeV) of energy. It may be reasonably expected that the bases will emit 100 or more X-rays before their constituent atoms have migrated more than a few Angstroms. Paradoxically, the energy lost by fast positive ions decreases in inverse proportion to their energy and the density of energy deposition decreases even more rapidly, so that the signal-to-damage ratio may improve at energies greater than 14 MeV.

(3) The wavelength of high-energy ions is much smaller than that of electrons of similar energy, so that the fundamental limit on resolution caused by diffraction in the objective lens is drastically altered. For 14 MeV nitrogen ions in a lens with relatively large, uncorrected aperture aberrations, the calculated optimum resolution is about 0.2 Angstroms, some 10 times better than for an electron microscope.

None of the advantages of high-energy heavy ions are of practical importance unless lenses can be manufactured to focus the ions. In general electrostatic lenses are less useful than magnetic ones for high velocity ions, because the magnetic focusing forces increase in proportion to ion velocity and become larger than practical electrical focusing forces. The prior art of electron microscopy teaches the use of cylindrical magnetic lenses in which the electrons pass through holes in the north and south poles of an electromagnet. In this configuration the focusing force is still not great enough for heavy ions, since the magnetic force is greatly reduced when the direction of motion of the ions is nearly parallel to the lines of magnetic field. The prior art of high energy physics teaches the use of magnetic quadrupole lenses (the so-called strong focusing principle used in the design of synchrotron accelerators) to overcome this difficulty. In fact estimates indicate that the focal length of suitably proportioned magnetic quadrupole lenses is about 3 centimeters for 14 MeV nitrogen ions which have 5 electrons removed (thereby forming a nitrogen nucleus with 2 electrons attached to it).

The prior art also teaches the use of ions in scanning ion microprobes. In U.S. Pat. Nos. 3,517,191 and 3,479,505 the claims describe a focused ion beam scanned across a specimen in conjunction with measurement of the current of secondary ions sputtered from the specimen or the current of secondary electrons knocked out of the specimen respectively. The first of these inventions utilizes ions of kiloelectonvolt (KeV)

energy such as are suitable to maximize the amount of sputtering. It does not contemplate use of MeV ions, which produce very little sputtering. The second of these inventions utilizes "the numbers of electrons emitted" or "the instantaneou rate of electron emission from the specimen". This invention utilizes amplifiers for measuring only the total current of large numbers of electrons emitted by the specimen, and its claims make no mention of detectors such as channel electron multipliers which are capable of registering the emission of individual electrons by the specimen. They also make no mention of measurement of the kinetic energy with which electrons are emitted, whereby the high energy Auger electrons can be isolated and the element which omits these electrons can be identified. Neither of these inventions utilizes X-rays emitted from the specimen nor mentions quadrupole lenses for focusing the ions. Although the claims are general, these instruments are limited in practice to focused beams about 10,000 Angstroms in diameter because of the large ion currents which are required.

Prior research has shown that the production of X-rays in interactions of positive ions with various elements can be very copious if ions more massive than helium and of KeV energy are used. In general fewer X-rays are produced than by MeV ions, but in certain specific cases the opposite may be true. If the radiation damage caused by the KeV ions is not important, they can also be used in scanning ion microscope which has the advantages of discrimination against X-rays from the substrate and of the high resolving power associated with ions. Practical attainment of this resolving power will depend on the quality of the objective lens utilized.

Prior research on the production of Auger electrons in interactions of positive ions with light elements has also shown that emission of electrons is more probable than X-ray emission. The difference may be several orders of magnitude for very light specimen elements. Thus interactions producing Auger electrons may be useful to produce large signals in a scanning ion microscope. However a given atom emits Auger electrons in comparable intensity at several different energies, thereby complicating the identification of elements when more than one element is present. The energy analyzers necessary to identify Auger electrons are difficult to construct with large entrance apertures, while semiconductor X-ray detectors can be made with large areas. Lastly the Auger electrons are easily scattered within the specimen, thereby suffering an alteration of their energy from the value which can be identified with a particular element.

With these preliminaries in mind, a specific embodiment of the invention will now be described. Positive ions are provided by a suitable ion accelerator, which may be a cyclotron, single stage van de Graaff, tandem van de Graaff, or other suitable type. They pass through a rigidly fixed object aperture 1 about 20 microns in diameter and are focused by magnetic quadrupole lenses 2,3. A magnetic quadrupole lens contains four magnetic poles the centers of which lie on a circle centered on the beam axis, the plane of which is perpendicular to the beam axis, while the poles are placed at 90 degree azimuthal anuglar intervals about the beam axis. Poles at 180 degree intervals are of the same strength and polarity, so that there is a zero of magnetic field along the beam axis and the magnitude of the magnetic field increases along paths in all directions from the axis. With two such quadrupoles in sequence along the beam axis, it is possible to make an elliptical image 4 of the object aperture with a demagnification of about 1/100. With three stages of such demagnification (consisting of the basic quadrupole doublets 2,3; 5,6; and 7,8 together with the refinements thereof described below) the total reduction is about a millionfold, yielding a Gaussian image 9 about 0.2 Angstrom in extent.

The actual image size is determined by diffraction of matter waves in the objective lens. This size decreases in inverse proportion to the lens diameter, or alternatively to the angle subtended by the lens diameter viewed from the specimen. As this angle is increased, however, the imperfections of the lens begin to be important. A spot is produced with a diameter which, roughly speaking, increases as the cube of the above-mentioned angle. As is well known in the prior art of electron microscopy, there is a minimum spot size and a corresponding optimum angle. For 14 MeV nitrogen ions in a lens with a focal length of 3 centimeters and a maximum aperture aberration coefficient of 3000 centimeters, the minimum spot size is about 0.2 Angstroms, corresponding to an area of approximately 0.04 square Angstroms, and the optimum angle is about 0.1 miliradian. An aperture 12 of about 6 microns diameter is therefore required in the objective lens in order to stop down the beam size for optimum resolution. Estimates using the characteristics of the most suitable accelerator ion sources suggest that about 250 ions per second will pass through such a focal spot. The ion current can be increased by sacrificing resolution; larger apertures suitable for a spot 2 Angstroms in radius are estimated to transmit 10,000 ions per second.

An important aspect of objective lens fabrication is the reduction of chromatic aberration, which is the displacement and change of size in the spot as unavoidable fluctuations in the ion energy or lens excitations occur. For this purpose prior research teaches that electrostatic quadrupoles must be used in addition to magnetic quadrupoles. Such combined lenses, which have heretofore only been designed for electrons, have a first order chromatic aberration coefficient which is zero. Prior research also teaches that the use of octopole electron lenses can result in systems which have zero third order aperture aberration coefficients. Such refinements could be expected to improve the minimum resolution of ion lenses to values smaller than the 0.2 Angstrom estimated above for a lens with large aperture aberrations.

A specific assembly which embodies these features is shown in FIG. 2 and is as follows: A magnetic quadrupole is constructed with magnetic poles 13, 14, 15 and 16 centered at azimuthal angles of 0, 90, 180, and 270 degrees respectively in a plane perpendicular to the beam axis. An blectrostatic quadrupole is constructed with electrodes 17, 18 19, and 20 having centers at azimuthal angles of 45, 135, 225, and 315 degrees respectively in the same reference plane. An electrostatic octopole component is provided by constructing a voltage supply such that the average voltage of the four quadrupole electrodes differs from the voltage on the four magnetic poles by an octopole voltage. Two assemblies 7 and 8 of this type provide the two electromagnetic quadrupoles required for stigmatic focusing with cancellation of chromatic aberration, as well as providing two independent octopoles and a third assembly similar except for omission of the magnet windings provides the third electric octopole required for cancellation of third order aperture aberrations. The schromatic quadrupole-octopole assemblies 7 and 8 and the octopole assembly 23 taken together form an objective lens.

When the beam of ions focused to a spot 9 of microscopic extent impinges upon the specimen 10 mounted on the substrate 11 as shown in FIG. 3, the energetic ions ionize individual atoms in the specimen and as a consequence the atoms emit quanta of radiations such as Auger electrons or characteristic X-rays. In the specific embodiment presently being described, X-rays produced in the specimen are detected by semiconductor radiation detectors 24 placed to cover as much of a sphere surrounding the specimen as is possible. Semiconductor radiation detectors are well known instruments, which provide an electrical pulse at the time of arrival of each X-ray quantum. The size of the pulse is proportional to the energy of the X-ray.

Other detectors than semiconductor detectors may be used which are sensitive to individual quanta emitted by the specimen. For example channel electronmultipliers, having a hollow glass tube as their main element, strip electron multipliers, having a flat electrode with a magnetic field parallel to its surface as their main element, and electron multiplier tubes, having a number of dynodes as thier main elements, all are well known detectors which can provide electrical pulses at the time of arrival of each individual electron. With the addition of suitable photoemissive surfaces these detectors can also be made sensitive to the arrival of individual X-ray quanta, particularly of the soft X-rays emitted by light elements. Electrons can be caused to travel from the specimen to these quantum detectors by providing a bias voltage between the specimen and the detector. When such electrons, accelerated by the bias voltage, travel between suitably shaped electrodes to which a second voltage supply is attached, the energy of the electrons may be measured in addition to their presence and time of arrival.

In order to enable the maximum contrast between specimen and substrate, the substrate ideally should not emit any X-rays equal in energy to those from the specimen. Thus the substrate should be fabricated of a different chemical element than the speciman, and should contain only trace quantities of chemical elements found in the specimen. Biologically important specimens contain carbon, nitrogen, and oxygen, as well as phosphorous and trace elements of various atomic numbers. The elements hydrogen, lithium, beryllium, and boron offer advantages as substrates, since they emit X-rays of lower energy than carbon which cannot interfere with pulses produced by specimen X-rays in a semiconductor X-ray detector. These elements all have atomic number less than 6. Boron is perhaps the best of these elements since it is commercially available in very pure form and can be evaporated into very thin and strong substrate foils by electron beam heating in vacuum. Thin substrates formed from chemical compounds of elements with atomic number less than 6 also serve the same purpose.

With reference again to FIG. 3, the beam of ions 25 is displaced in two dimensions across the surface of the specimen 10 by any suitable means. For example pairs of electrostatic deflection plates 26, 27 can be placed in the drift space preceding the objective lens, or dipole components can be added to the quadrupole excitation of the coils of the objective lens. The dipole component consists of unequal strengths on a pair of poles of the same polarity such as 13 and 15. In accordance with the principle of a scanning microscope, the spot 9 is swept in a raster across a microscopically small area 28 of the specimen 10. At those points in the raster where an ion impinges upon an atom in the specimen, an electrical pulse can occur in the detector 24.

The specific use to which such electrical pulses is not intended to be part of the described specific embodiment. However to indicate the usefulness of the invention the processing of these pulses will be briefly described. They can be used to modulate the intensity of a cathode ray tube in which the electron beam is swept in a raster pattern across the tube screen in synchronism with the ion beam as it is swept across the microscopic area 28. An enlarged display of the microscopic area is thereby produced, in which bright spots occur at positions corresponding to the position of the ion beam focus 9 from which each quantum is emitted. Since information about the energy of the quanta is simultaneously available and can be processed to determine what chemical element emitted the radiation, such a display can on principle be made for each of several chemical elements separately or of the separate displays superimposed. Superimposed color displays can be devised. In addition the sequential digital information obtained from the detectors as the beam sweeps out a raster pattern can be stored on magnetic tape or used as on-line input for computer programs designed to process the data in ways useful to a particular microscopist.

Many variations are possible within the spirit and scope of the invention and its above described specific embodiment and it is not intended to limit the invention except as defined in the following claims, which are:

I claim:

1. A scanning ion microscope comprising an accelerator of positive ions; a series of ion optical lenses including an objective lens which both direct the ions to a predetermined position on a specimen and focus the ions onto a microscopically small area of the specimen, thereby forming a directable focused ion beam; a detector sensitive to the occurrence and time of occurrence of individual atomic emissions produced by the interactions of positive ions with the specimen; electronic means for sweeping the focussed ion beam in a pattern across the specimen while recording the number of atomic emissions detected when the ion beam is at each point in the pattern; and wherein said objective lens comprises a plurality of both electric and magnetic quadrupoles arranged with an angular interval of 45 degrees between electric and magnetic poles, said interval being measured azimuthally around the ion beam axis irrespective of the position of such poles along the axis.

2. A scanning ion microscope as described in claim 1 in which the detector is sensitive to the energy of an individual atomic emission, and in which the number and energy of atomic emissions detected is recorded when the ion beam is at each point in the pattern.

3. A scanning ion microscope as described in claim 1 in which all four electrodes of each electric quadrupole are insulated from their surroundings, including the poles of the magnetic quadrupoles, and the average potential of the four electrodes differs from ground potential.

4. A scanning ion microscope as described in claim 3 in which the detector is sensitive to the energy of an individual atomic emission, and in which the number and energy of atomic emissions detected is recorded when the ion beam is at each point in the pattern.

5. A scanning ion microscope as described in claim (1) 1, 2, 3, or 4 in which the specimen is supported on a thin film of a material selected from the group consisting of boron, beryllium, or compounds containing only hydrogen, lithium, boron, (or) and beryllium.

* * * * *